(12) United States Patent
Gorman et al.

(10) Patent No.: US 8,922,412 B1
(45) Date of Patent: Dec. 30, 2014

(54) BIMODAL DIGITAL-TO-ANALOG CONVERSION

(71) Applicant: Xilinx, Inc., San Jose, CA (US)

(72) Inventors: Christopher M. Gorman, Tuam (IE); April M. Graham, Malahide (IE); John K. Jennings, Glenageary (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/874,040

(22) Filed: Apr. 30, 2013

(51) Int. Cl.
*H03M 1/66* (2006.01)
(52) U.S. Cl.
CPC .................................... *H03M 1/66* (2013.01)
USPC .......................................... 341/144; 341/153

(58) Field of Classification Search
USPC .................................. 341/120, 136, 144, 153
See application file for complete search history.

(56) References Cited

U.S. PATENT DOCUMENTS

| | | | | |
|---|---|---|---|---|
| 4,833,473 | A  * | 5/1989 | Dingwall | 341/154 |
| 6,417,793 | B1 * | 7/2002 | Bugeja et al. | 341/144 |
| 8,493,251 | B2 * | 7/2013 | Riches | 341/120 |
| 2014/0065979 | A1 * | 3/2014 | Terry | 455/73 |

\* cited by examiner

*Primary Examiner* — Brian Young
(74) *Attorney, Agent, or Firm* — W. Eric Webostad (57) ABSTRACT

An apparatus relating generally to digital-to-analog conversion is disclosed. In such an apparatus, a digital-to-analog converter ("DAC") device includes a source DAC and a sink DAC selectively coupled to one another. The source DAC provides a first bias to the sink DAC in a sink mode, and the sink DAC provides a second bias to the source DAC in a source mode.

19 Claims, 5 Drawing Sheets

BIMODAL DIGITAL-TO-ANALOG CONVERSION

TECHNICAL FIELD

The following description relates to integrated circuit devices ("ICs"). More particularly, the following description relates to bimodal digital-to-analog conversion for an IC.

BACKGROUND

Digital-to-analog conversion provides an analog output responsive to a digital input. Along those lines, a reference bias current may be provided for such conversion. Furthermore, such analog output is a current-based output, which may be for a source mode of operation or a sink mode of operation. To support both sink and source modes of operation, generally two DACs are used, namely a PMOS DAC for the source mode, and an NMOS DAC for the sink mode, where each of such DACs includes a dedicated current bias circuit with a current mirror.

As there is more demand for digital-to-analog conversion, such conversion has increasingly led to narrower and narrower tolerable inaccuracy in gain error. Along those lines, a dedicated current bias circuit included in a DAC has significant limitations. Unfortunately, providing an accurate current mirror for such dedicated current bias circuit that covers a wide range of currents and does not vary too much, for instance, over temperature may add considerable circuit overhead, and still may not support a sufficiently narrow range of tolerable inaccuracy.

Accordingly, it would be useful to provide a DAC that overcomes one or more of the above-described limitations.

SUMMARY

An apparatus relates generally to digital-to-analog conversion. In such an apparatus, a digital-to-analog converter ("DAC") device includes a source DAC and a sink DAC selectively coupled to one another. The source DAC provides a bias to the sink DAC in a sink mode.

Another apparatus relates generally to digital-to-analog conversion. In such an apparatus, a DAC device includes a source DAC and a sink DAC selectively coupled to one another. The sink DAC provides a bias to the source DAC in a source mode.

A method relates generally to digital-to-analog conversion. In such a method, a mode is selected. An input code is input to a first DAC of a pair of digital-to-analog converters ("DACs") in the mode. A reference code is input to a second DAC of the pair of DACs in the mode. A first bias is provided from a reference source to the second DAC for the mode. An output from the second DAC is provided to the first DAC as a second bias. The mode is selected from a group consisting of a sink mode and a source mode.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

As described below in additional detail, a bimodal DAC capable of providing a source/sink output is described, where rather than using a dedicated current bias circuit having a current mirror for each DAC in such bimodal DAC, two current steering DACs, neither of which has to include a dedicated current bias circuit with a current mirror, are used to generate either a source output or a sink output at a time.

During operation, one of a source DAC or a sink DAC of such bimodal DAC is driving an analog output from such bimodal DAC on positive and negative output nodes thereof. As described below in additional detail, the other of such DACs may be used as a reference DAC, effectively replacing a dedicated current bias circuit having generally a fixed reference, to generate a bias current for a DAC of such bimodal DAC driving such analog output. Because each DAC of a pair of DACs of a bimodal DAC is programmable, each such DAC provides additional functionality as a bias current output therefrom which can be programmed by setting a reference input code to such DAC. For example, if output of a bimodal DAC is terminated with resistors having some tolerance, a user may adjust to such resistors by programming or otherwise setting such reference input code to adjust for such environmental factor. This is just one example of an environmental factor that may be accounted for by setting a reference input code, and there are many others.

Furthermore, more intrinsically with respect to each DAC in a bimodal DAC, programmability allows gain error(s) of either or both DACs of such pair to be calibrated or otherwise accounted for. In other words, by inputting a reference input code to one DAC to obtain a reference bias current output therefrom, such reference bias current may be provided to the other DAC to adjust for gain error of such other DAC, and vice versa.

As described below in additional detail, a bimodal DAC may include a single current steering PMOS DAC and a single current steering NMOS DAC which may be selectively coupled to one another responsive to whether a source mode or a sink mode is in use. A bias current for such PMOS DAC may be provided by such NMOS DAC in a source mode, and vice versa for a sink mode. This may allow a full-scale output current of such PMOS DAC to be provided by programmed adjustment thereof responsive to a reference input code to such NMOS DAC for a source mode, and vice versa for a sink mode. Along those lines, gain errors may be at least substantially calibrated out of a bimodal DAC to allow for a narrow tolerance range over a wide or full scale range of currents.

With the above general understanding borne in mind, various embodiments for bimodal digital-to-analog conversion are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
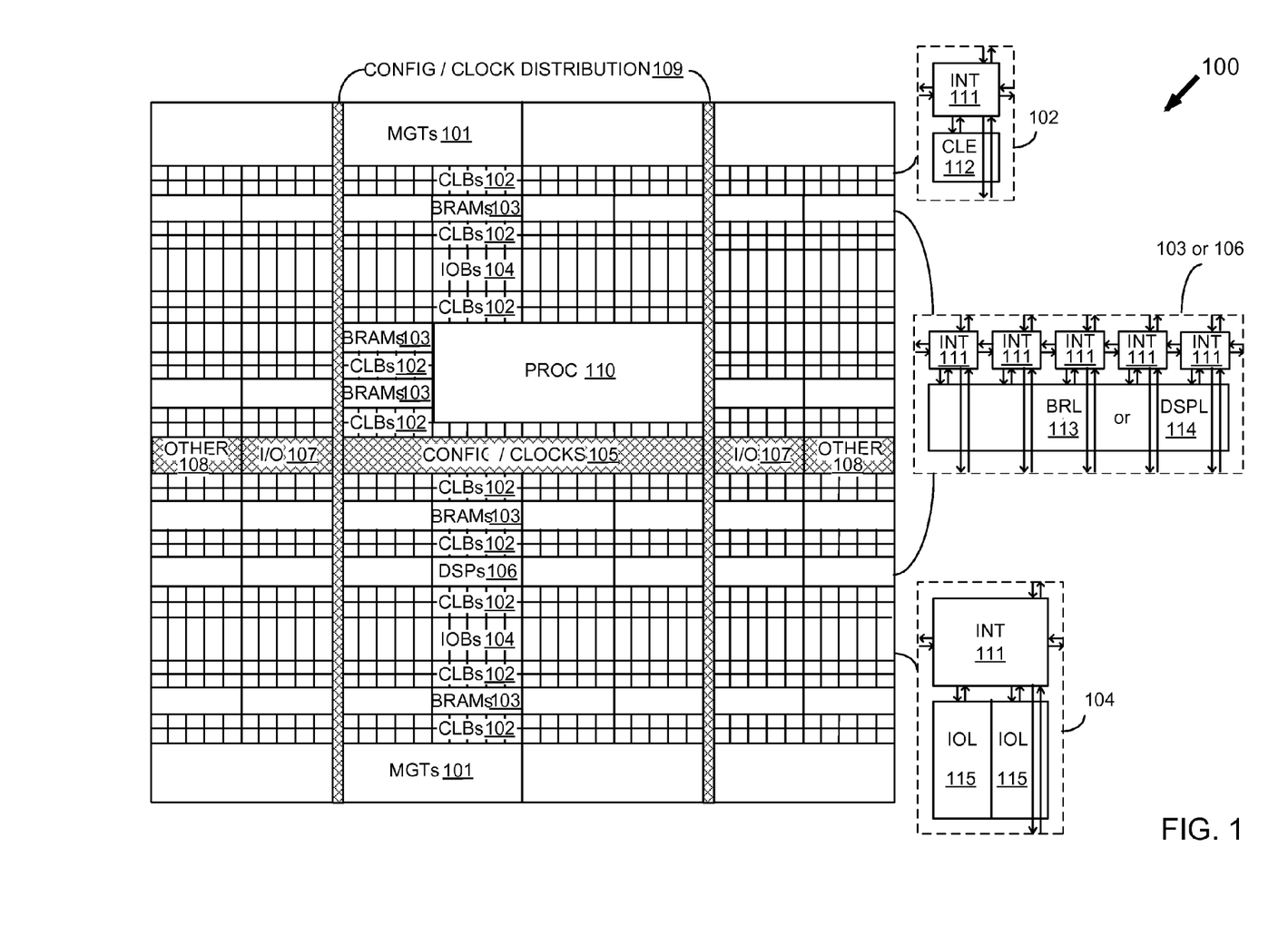
FIG. 1 is a simplified block diagram depicting an exemplary columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
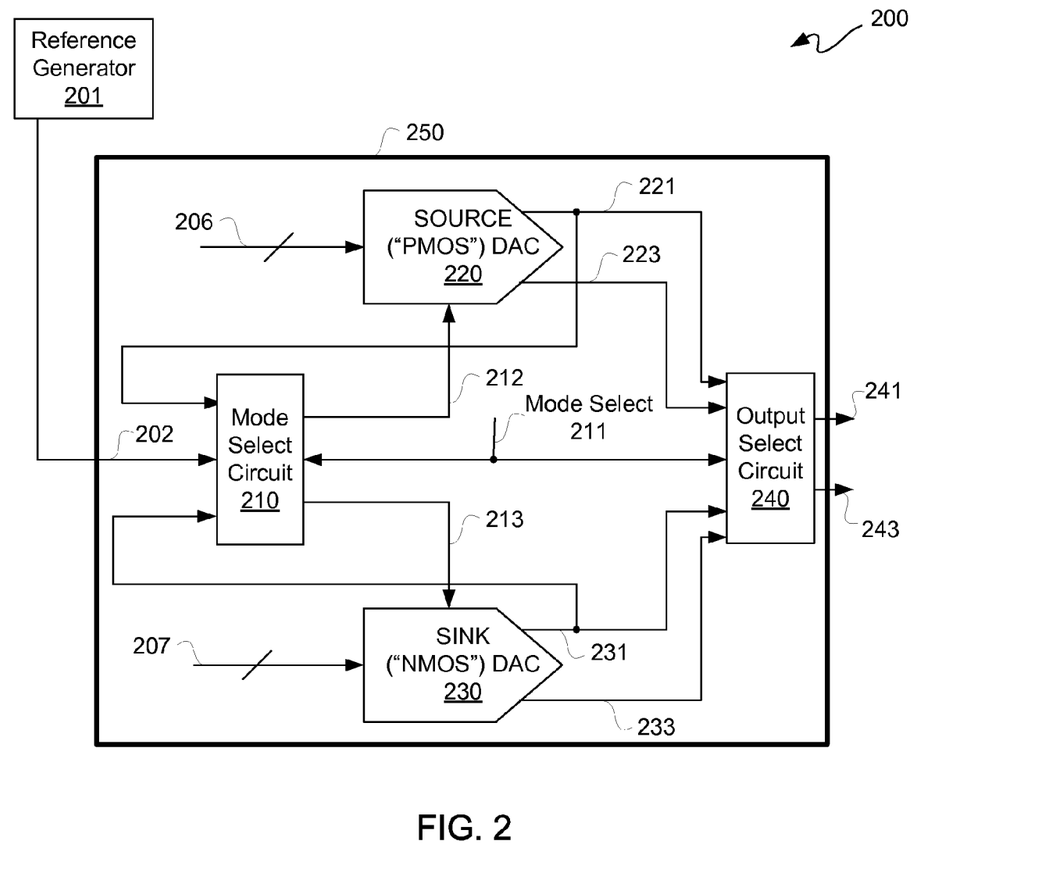
FIG. 2 is a block diagram depicting an exemplary digital-to-analog converter ("DAC") system.

FIG. 2 is a block diagram depicting an exemplary bimodal digital-to-analog converter ("DAC") system 200. Bimodal DAC system ("DAC system") 200 may be included in FPGA 100 of FIG. 1, or any IC for that matter, and as such DAC system 200 may be formed as part of an IC die.

DAC system 200 includes a reference generator 201 and a bimodal DAC 250. Bimodal DAC 250 includes a mode select circuit 210, an output select circuit 240, and a pair of DACs, namely a source DAC 220 and a sink DAC 230. Furthermore, DACs 220 and 230 may be binary, unary, and/or segmented DACs, such as for example binary coded, thermometer coded, or a combination thereof.

Reference generator 201 may be an on-chip or internal reference generator for providing a reference current bias 202. Internal reference generator 201 may be trimmed during manufacturing. There may be a separate current mirror block, not shown, used to generate a current, from which current may be generated using a current mirror circuit; however, for purposes of clarity and not limitation, it shall be assumed that such current mirror block is internal to internal reference generator 201. During trimming, such as at wafer level or die level, internal reference generator 201 may be trimmed to be within a particular tolerance; however, such trimming is generally performed for a normal operating temperature and a normal supply voltage level. However, a die including such internal reference generator 201 may be operated at other than such normal operating temperature and/or at other than such normal supply voltage level. Accordingly, it should be understood that neither of DAC 220 nor DAC 230 has to include a dedicated current bias circuit having an accurate current mirror, but may be coupled to a common reference generator 201 which effectively may be field programmed to adjust for one or more environmental conditions by using a complimentary DAC.

Bimodal DAC 250 may operate in either a sink mode or a source mode responsive to mode select signal 211. Along those lines, bimodal DAC 250 may be used to only in a source mode, may be used only in a sink mode, or may be switched from a source mode to a sink mode and/or vice versa. Mode select signal 211, as well as reference current bias 202, may be provided to mode select circuit 210.

A code 206, which may be an input or data ("input") code 206 or a reference code 206 depending on whether bimodal DAC 250 is in a sink mode or a source mode, may be provided to source DAC 220. When used as a reference code 206, such code may be used to operate a DAC full-scale, and when used as an input code 206, effectively such input code would indicate where on such full-scale a DAC is to be operated. Thus, by having a complimentary pair of DACs, one can be programmatically adjusted to more accurately operate the other, and vice versa.

Source DAC 220 may have a positive side output 221 and a negative side output 223. Either of outputs 221 or 223 may be provided as a feedback input to mode select circuit 210 to provide a feedback current bias. For purposes of clarity by way of example and not limitation, it shall be assumed that a positive side output 221 is provided as a feedback current bias.

A code 207, which may be an input or data ("input") code 207 or a reference code 207 depending on whether bimodal DAC 250 is in a source mode or a sink mode, may be provided to sink DAC 230. Sink DAC 230 may have a positive side output 231 and a negative side output 233. Either of outputs 231 or 233 may be provided as a feedback input to mode select circuit 210 to provide another feedback current bias. For purposes of clarity by way of example and not limitation, it shall be assumed that a positive side output 231 is provided as such other feedback current bias.

Mode select circuit 210 may be configured to provide reference current bias 202 and a selected one of feedback current biases 221 or 231 as outputs responsive to mode select signal 211. Along those lines, mode select circuit 210 may provide a current bias signal 212 as a control input to source DAC 220 and may provide a current bias signal 213 as a control input to sink DAC 230.

An analog output may be provided from a positive output 221 and a negative output 223 to output select circuit 240, and likewise, another analog output may be provided from a positive output 231 and a negative output 233 to select circuit 240. Along those lines, mode select signal 211 may be provided to output select circuit 240 to select an analog output provided via positive side node 241 and negative side node 243 sourced from source DAC 220 during a source mode and sourced from sink DAC 230 during a sink mode. Hence, when bimodal DAC 250 is switched from a source mode to a sink mode, and vice versa, the direction of an output current from output select circuit 240 is inverted.

In a source mode, internal reference current 202 provided as a reference bias current 213 to NMOS DAC 230 may be scaled by such DAC responsive to a reference input code 207 provided thereto. Thus, by adjusting or otherwise setting such reference code 207 supplied to NMOS DAC 230, a full-scale current of PMOS DAC 220 can be set, or more particularly programmably set. This setting may be based on a static calibration, and/or this setting may be a dynamic adjustment using feedback input.

In a sink mode, internal reference current 202 provided as a reference bias current 212 to PMOS DAC 220 may be scaled by such DAC responsive to a reference input code 206 provided thereto. Thus, by adjusting or otherwise setting such reference code 206 supplied to PMOS DAC 220, a full-scale current of NMOS DAC 230 can be set, or more particularly programmably set. This setting may likewise be based on a static calibration, and/or this setting may be a dynamic adjustment using feedback input.

Figure 3:
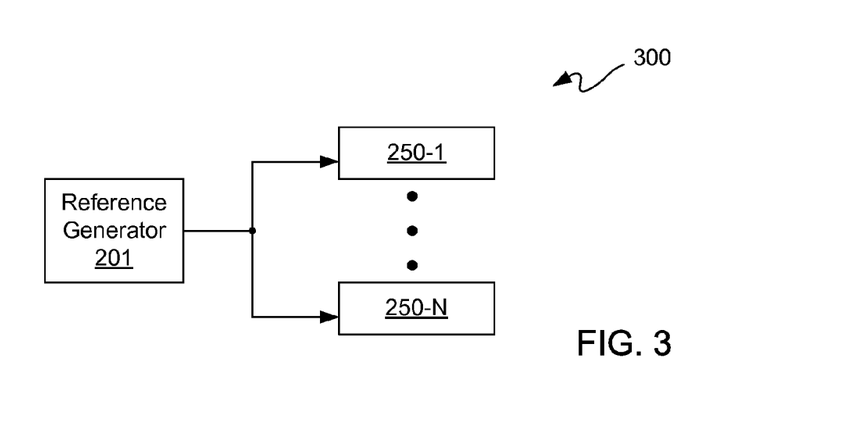
FIG. 3 is a block diagram depicting an exemplary multi-DAC system.

FIG. 3 is a block diagram depicting an exemplary multi-DAC system 300. Multi-DAC system 300 may be formed as part of an IC die. Multi-DAC system 300 includes a reference generator 201 coupled to a plurality of bimodal DACs 250-1 through 250-N for N a positive integer greater than one. Bimodal DAC 250 of FIG. 2 may be any of such bimodal DACs of multi-DAC system 300. Accordingly, a single reference generator 201 may support more than one bimodal DAC 250.

Figure 4:
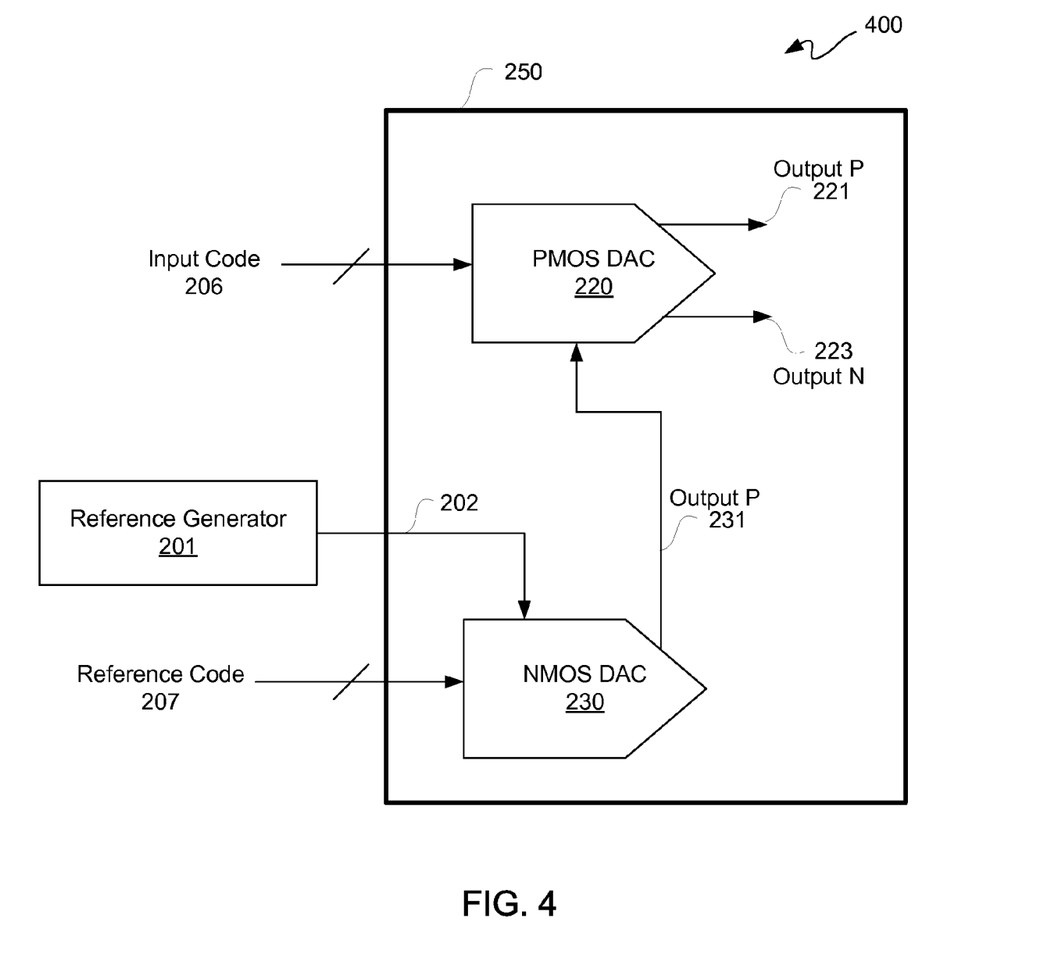
FIG. 4 is the block diagram of FIG. 2 simplified for the bimodal DAC thereof in a source mode.

FIG. 4 is the block diagram of FIG. 2 simplified for clarity to further understand operation of bimodal DAC 250 in a source mode 400. Again, source mode 400 may be selected responsive to mode select signal 211, and though not illustratively depicted in FIG. 4, such mode select circuit 210 responsive to such state of mode select signal 211 may provide signal couplings as illustratively depicted in FIG. 4. Additionally, positive side node output 221 and negative side node output 223 may be sourced from PMOS DAC 220 to drive an analog output from bimodal DAC 250 in a source mode 400.

An input code 206, which may be multiple bits wide, may be provided as a digital data input to source DAC 220 for source mode 400. Source DAC 220 may be a PMOS DAC 220. By PMOS DAC, it is generally meant that transistors used for or in an analog stage or analog cell of such PMOS DAC are PMOS transistors. Even more particularly, by PMOS DAC, it may mean that transistors used for current steering, current sourcing, and cascode switching in an analog stage or cell in such PMOS DAC are PMOS transistors.

However, none of these definitions are meant to completely preclude the use of NMOS transistors in PMOS DAC 220, as NMOS transistors may be used in PMOS DAC 220 though generally not in an analog stage or cell.

A reference code 207, which may be multiple bits wide, may be provided as a digital data input to sink DAC 230 for source mode 400. Sink DAC 230 may be a NMOS DAC 230. By NMOS DAC, it is generally meant that transistors used for or in an analog stage or analog cell of such NMOS DAC are NMOS transistors. Even more particularly, by NMOS DAC, it may mean that transistors used for current steering, current driving, and cascode switching in an analog stage or cell in such NMOS DAC are NMOS transistors. However, none of these definitions are meant to completely preclude the use of PMOS transistors in NMOS DAC 230, as PMOS transistors may be used in NMOS DAC 230 though generally not in an analog stage or cell.

Reference code 207 may be a code determined by a manufacture or a user of bimodal DAC 250 to adjust a control input bias, as described below in additional detail. A reference code 207 may be used to cause NMOS DAC 230 to generate a control bias input to PMOS DAC 220 via in this example positive side output 231 from NMOS DAC 230. Reference code 207 may be associated with an IC die in which bimodal DAC 250 is implemented, and such reference code 207 may be used to calibrate or enhance accuracy of PMOS DAC 220 during operation in source mode 400. In other words, bimodal DAC 250 in a source mode has a PMOS DAC 220 which is used to provide an analog output to the outside world via outputs 221 and 223 responsive to input code 206; however, in a source mode, an NMOS DAC 230 of such bimodal DAC 250 is not used to provide an analog output to the outside world but rather is used to enhance accuracy of operation of PMOS DAC 220.

Along the above lines, reference code 207 may be characterized using feedback from PMOS DAC 220 during a calibration of operation. Again, such calibration may be performed by a manufacturer of an IC die in which bimodal DAC 250 is located. Optionally, an IC die having bimodal DAC 250 which is mounted to a circuit board may be calibrated, including calibration of PMOS DAC 220 to produce reference code 207, to account for environmental effects associated with being mounted to such a circuit board.

Reference generator 201 produces a reference current bias 202 which is provided as a control bias input to NMOS DAC 230 for a source mode 400. Responsive to such reference current bias 202 and reference code 207, NMOS DAC 230 provides positive side output 231 as a control bias input to PMOS DAC 220.

Figure 5:
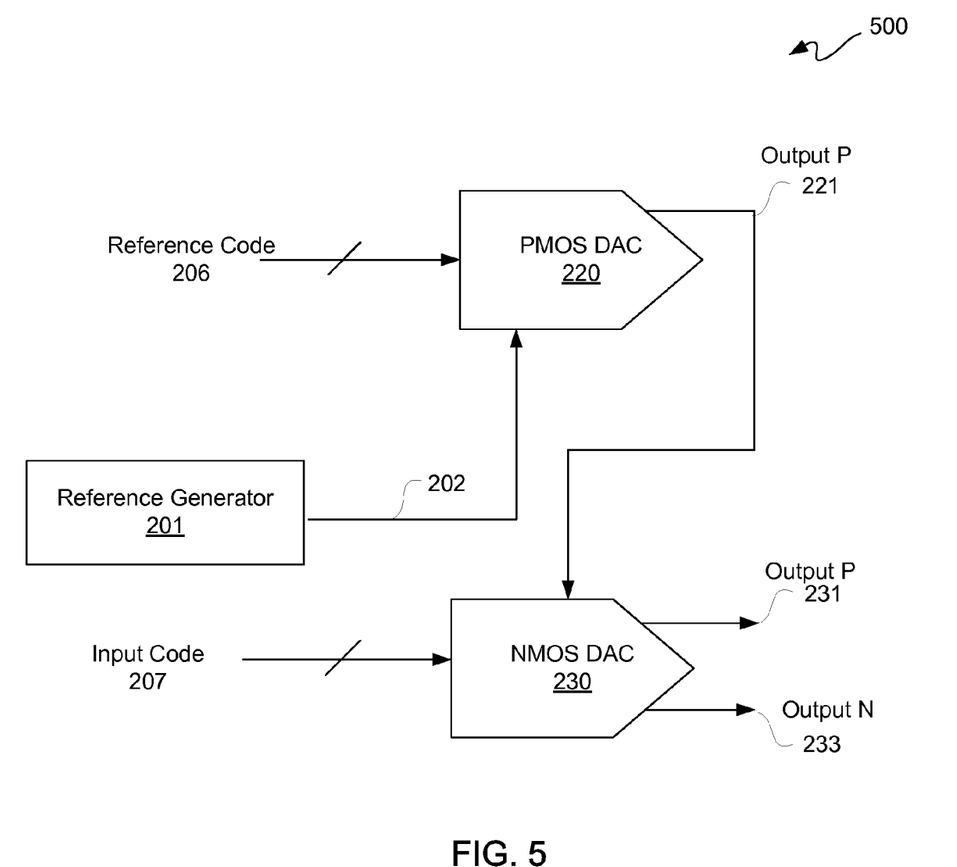
FIG. 5 is the block diagram of FIG. 2 simplified for the bimodal DAC thereof in a sink mode.

FIG. 5 is the block diagram of FIG. 2 simplified for bimodal DAC 250 in a sink mode 500. Again, sink mode 500 may be selected responsive to mode select signal 211, and though not illustratively depicted in FIG. 5, such mode select circuit 210 responsive to such state of mode select signal 211 may provide signal couplings as illustratively depicted in FIG. 5. Additionally, positive side node output 231 and negative side node output 233 may be sourced from NMOS DAC 230 to drive an analog output from bimodal DAC 250 in a sink mode 500.

An input code 207, which may be multiple bits wide, may be provided as a digital data input to sink DAC 230 for sink mode 500. Again, sink DAC 230 may be an NMOS DAC 230. A reference code 206, which may be multiple bits wide, may be provided as a digital data input to source DAC 220 for sink mode 500. Again, source DAC 220 may be a PMOS DAC 220.

Reference code 206, like reference code 207, may be a code determined by a manufacturer or a user of bimodal DAC 250 to adjust a control input bias, as described below additional detail. A reference code 206 may be used to cause PMOS DAC 220 to generate a control bias input to NMOS DAC 230 via in this example positive side output 221 from PMOS DAC 220. Reference code 206 may be associated with an IC die in which bimodal DAC 250 is implemented, and such reference code 206 may be used to calibrate or enhance accuracy of NMOS DAC 230 during operation in sink mode 500. In other words, bimodal DAC 250 in a sink mode has an NMOS DAC 230 which is used to provide an analog output to the outside world via outputs 221 and 223 responsive to input code 206; however, in a sink mode, an PMOS DAC 220 of such bimodal DAC 250 is not used to provide an analog output to the outside world but rather is used to enhance accuracy of operation of NMOS DAC 230.

Along the above lines, reference code 206 may be characterized using feedback from NMOS DAC 230 during a calibration of operation. Again, such calibration may be performed by a manufacturer of an IC die in which bimodal DAC 250 is located. Optionally, an IC die having bimodal DAC 250 which is mounted to a circuit board may be calibrated, including calibration of NMOS DAC 230, to produce reference code 206, to account for environmental effects associated with being mounted to such a circuit board.

Reference generator 201 produces a reference current bias 202 which is provided as a control bias input to PMOS DAC 220 for a sink mode 500. Responsive to such reference current bias 202 and reference code 206, PMOS DAC 220 provides positive side output 221 as a control bias input to NMOS DAC 230.

To recapitulate with simultaneous reference to FIGS. 2 through 5, a bimodal DAC 250 is capable of operating in a sink mode and a source mode, though not at the same time, where such bimodal DAC 250 includes a source DAC 220 and a sink DAC 230 which are selectively coupled to one another responsive to a selected mode as between such sink mode and such source mode. In a source mode 400, a sink DAC 230 provides a control bias input to a source DAC 220. In a sink mode 500, a source DAC 220 provides a control bias input to a sink DAC 230. Each such control bias input may be provided as a feedback from a positive side output of an associated DAC used as a bias reference generator. Along those lines, a DAC which is not used for providing an analog data output during an operational mode is used as a bias reference generator for a DAC which is used for providing such an analog data output during such an operational mode. A reference current generator 201 or other reference current source may be selectively coupled to source DAC 220 in sink mode 500 or sink DAC 230 in source mode 400.

Figure 6:
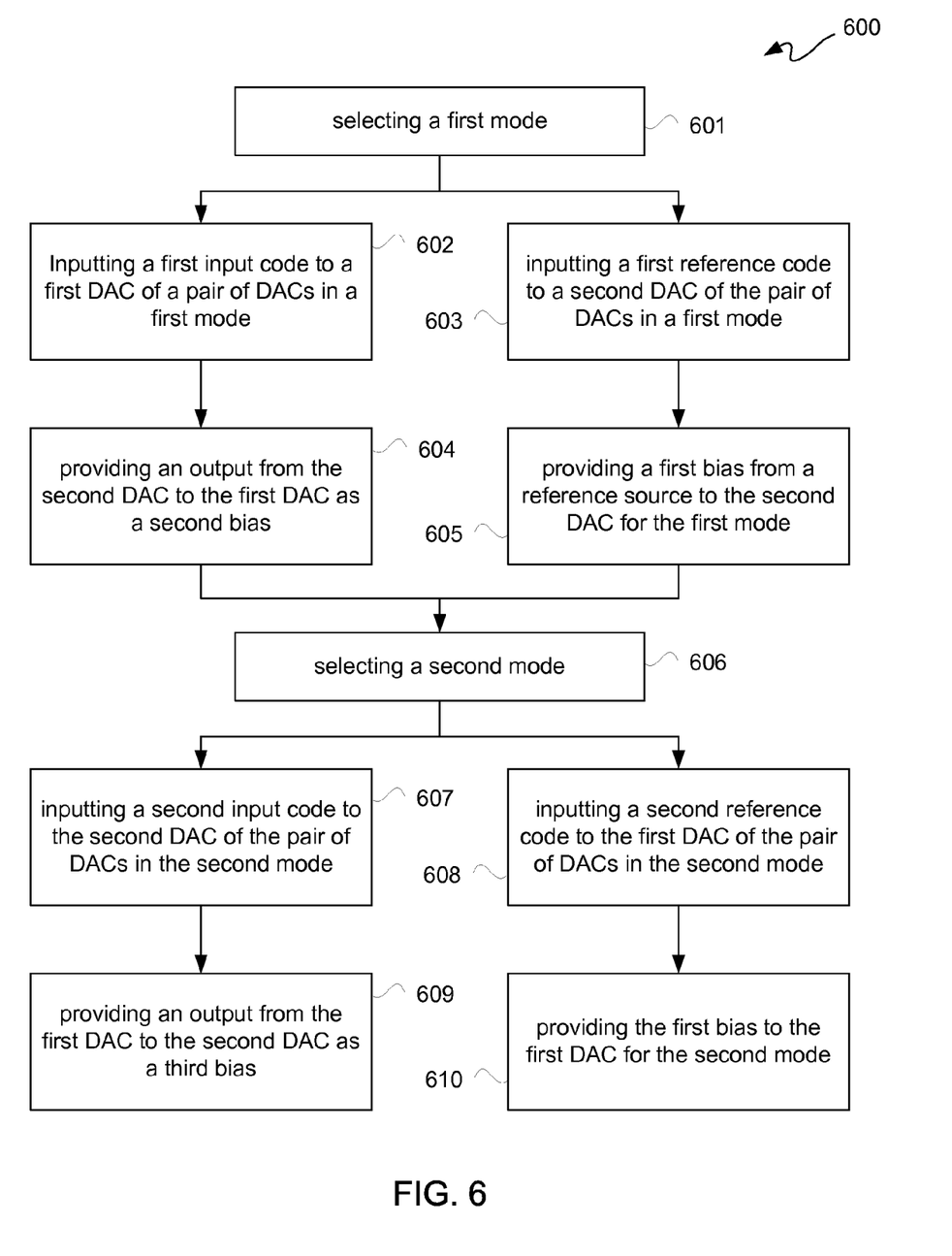
FIG. 6 is a flow diagram depicting an exemplary bimodal flow 600.

With the above description borne in mind, FIG. 6, which is a flow diagram depicting an exemplary bimodal flow 600, is described. At 601, a first mode is selected. Such first mode selected may be either a sink mode or a source mode.

Responsive to such first mode selected at 601, at 602 a first input code is input to a first DAC of a pair of DACs for such first mode, and in parallel at 603 a first reference code is input to a second DAC of such pair of DACs for such first mode. At 605 from 603, a first bias from a reference source, such as reference generator 201 for example, is provided to such second DAC for such first mode of operation. At 604 from 602, an output from such second DAC is provided as a second bias to such first DAC.

From 604 and 605, at 606 a second mode of operation different from such first mode of operation may be selected, where such second mode of operation is either a source mode or a sink mode.

From 606, at 607 a second input code may be input to such second DAC of such pair of DACs for operation and such second mode selected at 606. From 606 and in parallel with 607, at 608 a second reference code may be input to such first DAC of such pair of DACs for such second mode of operation selected at 606.

At 609, from 607, an output from such first DAC may be provided as an input to such second DAC as a third bias for such second mode selected at 606. At 610, from 608, such first bias may be provided to such first DAC for operation in such second mode selected at 606.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
a digital-to-analog converter ("DAC") device that includes a source DAC and a sink DAC selectively coupled to one another;
wherein an output from the source DAC provides a first bias to the sink DAC in a sink mode; and
a reference current source selectively coupled to the source DAC or the sink DAC;
wherein the reference current source is selectively coupled to the source DAC in the sink mode to provide a second bias to the source DAC.

2. The apparatus according to claim 1, wherein an output from the sink DAC provides the second bias to the source DAC in the source mode.

3. The apparatus according to claim 2, wherein a positive side of the output of the source DAC provides the first bias in the sink mode.

4. The apparatus according to claim 3, wherein a positive side of the output of the sink DAC provides the second bias in the source mode.

5. The apparatus according to claim 4, wherein
the second bias is provided from the reference current source to the source DAC in the sink mode; and
the first bias is provided from the reference current source to the sink DAC in the source mode.

6. The apparatus according to claim 5, wherein:
the source DAC is coupled to receive an input code in the source mode;
the sink DAC is coupled to receive a reference code in the source mode; and
the reference code is to adjust the second bias.

7. The apparatus according to claim 5, wherein:
the source DAC is coupled to receive a reference code in the sink mode; and
the sink DAC is coupled to receive an input code in the sink mode;
wherein the reference code is to adjust the first bias.

8. The apparatus according to claim 2, wherein the source DAC comprises a PMOS DAC.

9. The apparatus according to claim 3, wherein the sink DAC comprises an NMOS DAC.

10. An apparatus, comprising:
a digital-to-analog converter ("DAC") device that includes a source DAC and a sink DAC selectively coupled to one another;
wherein an output from the sink DAC provides a first bias to the source DAC in a source mode; and
a reference current source selectively coupled to the source DAC or the sink DAC;
wherein the reference current source is selectively coupled to the sink DAC in the source mode to provide a second bias to the sink DAC.

11. The apparatus according to claim 10, wherein the source DAC comprises a PMOS DAC.

12. The apparatus according to claim 11, wherein the sink DAC comprises an NMOS DAC.

13. A method, comprising:
selecting a first mode;
inputting a first input code to a first digital-to-analog converter ("DAC") of a pair of digital-to-analog converters ("DACs") in the first mode;
inputting a first reference code to a second DAC of the pair of DACs in the first mode;
providing a first bias from a reference source to the second DAC for the first mode; and
providing an output from the second DAC to the first DAC as a second bias;
wherein the first mode is selected from a group consisting of a sink mode and a source mode.

14. The method according to claim 13, further comprising:
selecting a second mode;
inputting a second input code to the second DAC of the pair of DACs in the second mode;
inputting a second reference code to the first DAC of the pair of DACs in the second mode;
providing the first bias to the first DAC for the second mode; and
providing an output from the first DAC to the second DAC as a third bias;
wherein the second mode is selected from the group consisting of the sink mode and the source mode, and the second mode is not the first mode.

15. The method according to claim 14, wherein:
the second bias is responsive to the first reference code; and
the first reference code is responsive to the output of the first DAC.

16. The method according to claim 15, wherein:
the third bias is responsive to the second reference code; and
the second reference code is responsive to the output of the second DAC.

17. The method according to claim 16, wherein the first bias, the second bias, and the third bias are each a respective current bias.

18. The method according to claim 16, wherein:
the first DAC comprises a source DAC;
the second DAC comprises a sink DAC;
the first mode is a source mode; and
the second mode is a sink mode.

19. The method according to claim 18, wherein:
the source DAC comprises a PMOS DAC; and
the sink DAC comprises an NMOS DAC.

* * * * *